(12) United States Patent
Ando et al.

(10) Patent No.: US 10,373,835 B2
(45) Date of Patent: *Aug. 6, 2019

(54) METHOD OF LATERAL OXIDATION OF NFET AND PFET HIGH-K GATE STACKS

(71) Applicant: INTERNATIONAL BUSINESS MACHINES CORPORATION, Armonk, NY (US)

(72) Inventors: Takashi Ando, Tuckahoe, NY (US); Robert H. Dennard, Croton-on-Hudson, NY (US); Martin M. Frank, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/892,884

(22) Filed: Feb. 9, 2018

(65) Prior Publication Data
US 2018/0174847 A1 Jun. 21, 2018

Related U.S. Application Data

(63) Continuation of application No. 15/247,999, filed on Aug. 26, 2016, now Pat. No. 9,941,128, which is a (Continued)

(51) Int. Cl.
*H01L 21/28* (2006.01)
*H01L 29/40* (2006.01)
(Continued)

(52) U.S. Cl.
CPC .... *H01L 21/28176* (2013.01); *H01L 21/0223* (2013.01); *H01L 21/02244* (2013.01); *H01L 21/28* (2013.01); *H01L 21/28247* (2013.01); *H01L 21/823462* (2013.01); *H01L 21/823857* (2013.01); *H01L 21/823864* (2013.01);
(Continued)

(58) Field of Classification Search
CPC ....... H01L 21/28176; H01L 21/823462; H01L 29/401
See application file for complete search history.

(56) References Cited

U.S. PATENT DOCUMENTS 7,696,036 B2 * 4/2010 Bu .................. H01L 21/823857
257/E21.639
9,466,492 B2 10/2016 Ando et al.
(Continued)

OTHER PUBLICATIONS

List of IBM Patents or Patent Applications Treated as Related; (Appendix P), Filed Feb. 9, 2018; 2 pages.

*Primary Examiner* — Dung A. Le
(74) *Attorney, Agent, or Firm* — Cantor Colburn LLP; Vazken Alexanian

(57) ABSTRACT

A method for fabricating a semiconductor circuit includes obtaining a semiconductor structure having a gate stack of material layers including a high-k dielectric layer; oxidizing in a lateral manner the high-k dielectric layer, such that oxygen content of the high-k dielectric layer is increased first at the sidewalls of the high-k dielectric layer; and completing fabrication of a n-type field effect transistor from the gate stack after laterally oxidizing the high-k dielectric layer of the gate stack.

16 Claims, 15 Drawing Sheets

Related U.S. Application Data continuation of application No. 14/604,916, filed on Jan. 26, 2015, now Pat. No. 9,466,492.

(60) Provisional application No. 61/987,620, filed on May 2, 2014.

(51) Int. Cl.
| | |
|---|---|
| *H01L 29/51* | (2006.01) |
| *H01L 21/8234* | (2006.01) |
| *H01L 21/8238* | (2006.01) |
| *H01L 29/66* | (2006.01) |
| *H01L 21/02* | (2006.01) |
| *H01L 27/092* | (2006.01) |
| *H01L 29/49* | (2006.01) |
| *H01L 29/78* | (2006.01) |

(52) U.S. Cl.
CPC .......... *H01L 27/092* (2013.01); *H01L 29/40* (2013.01); *H01L 29/401* (2013.01); *H01L 29/4983* (2013.01); *H01L 29/51* (2013.01); *H01L 29/512* (2013.01); *H01L 29/6653* (2013.01); *H01L 29/6656* (2013.01); *H01L 29/78* (2013.01)

(56) References Cited

U.S. PATENT DOCUMENTS

2014/0357028 A1* 12/2014 Sassiat ............ H01L 21/823807
　　　　　　　　　　　　　　　　　　　　438/217
2016/0365252 A1　12/2016 Ando

* cited by examiner

METHOD OF LATERAL OXIDATION OF NFET AND PFET HIGH-K GATE STACKS

DOMESTIC PRIORITY

This application is a division of U.S. patent application Ser. No. 15/247,999, filed Aug. 26, 2016, entitled "METHOD OF LATERAL OXIDATION OF NFET AND PFET HIGH-K GATE STACKS," which is a continuation of U.S. patent application Ser. No. 14/604,916, filed Jan. 26, 2015, entitled "METHOD OF LATERAL OXIDATION OF NFET AND PFET HIGH-K GATE STACKS," which claims priority to U.S. Provisional Application No. 61/987,620, filed May 2, 2014, entitled "METHOD OF LATERAL OXIDATION OF NFET HIGH-K GATE STACKS," each application is incorporated herein by reference in its entirety.

BACKGROUND

The present invention relates generally to semiconductor structures and methods for fabricating those structures. Particularly, the invention relates to a semiconductor structure and a method for laterally oxidizing nFET high-k gate stacks.

As integrated circuits become smaller, maintaining semiconductor device performance and controlling threshold voltage becomes more difficult. Field Effect Transistors (FET), which lie at the core of an integrated circuit, typically are characterized by being of a hole conduction type, called pFET, or being of an electron conduction type, called nFET. It is known in the art that decreasing the size of a FET device leads to a decrease in controlling their performance. This is due in part to the thickness of the gate dielectric component becoming thinner as the size of the FET device decreases. Once the gate dielectric becomes too thin leakage begins to reach unacceptable levels and large currents may be able to flow through the dielectric material via direct tunneling. As a result, improving semiconductor device performance without decreasing the thickness of the gate dielectric has become increasingly important.

As is known to those skilled in the art of semiconductor design and fabrication, one such method for improving performance of a FET while maintaining adequate gate dielectric thickness is by replacing the traditional gate dielectric material with another material having an acceptable equivalent oxide thickness (EOT). An acceptable EOT is achieved by using a material that has a greater dielectric capacitance than the traditional gate dielectric material, thereby permitting the substitute material to have a greater thickness while maintaining a reaction speed comparable to that of the traditional gate dielectric material. Suitable materials are characterized as having a high dielectric constant, "k". Accordingly such materials are known in the art as "high-k" materials. A high-k value is one that is greater than the dielectric constant of the traditional gate dielectric material silicon dioxide, which is approximately 3.9. While high-k materials must provide an increased dielectric capacitance, utilizing such materials is known in the art to often result in a threshold voltage ($V_T$) that is different from what is desirable from a circuit perspective. As a result, a method for controlling $V_T$ of high-k gate dielectric FET devices has become increasingly sought after.

Controlling $V_T$ in high-k dielectric FET devices is particularly significant for complementary metal oxide semiconductor (CMOS) devices because CMOS devices operate at lower voltages, and as the operating voltage of a semiconductor device decreases, $V_T$ also must decrease, and consequently, variations in $V_T$ become less tolerable. $V_T$ is affected by known factors, but as the size of FET devices has decreased, the traditional methods of setting $V_T$ (i.e., adjusting body and channel doping) have become less effective. One method for controlling $V_T$ with high-k gate dielectric FET devices utilizes an additional material layer known in the art as a "capping layer". However capping layers can have undesirable effects, such as increasing EOT or degrading carrier mobility. Furthermore, different capping layers are often desired for n-type FET (nFET) and p-type FET devices (pFET) devices, requiring complex and costly integration schemes.

Another known method for controlling $V_T$ that remains promising is oxidation of the gate dielectric. Oxidation of the high-k dielectric layer directly affects $V_T$ and has proven to be very effective for intentionally tuning $V_T$ of FET devices. However, while oxidation of high-k gate stacks is known to benefit the $V_T$ of p-type FET devices (pFET), it also is commonly thought to degrade the $V_T$ of nFET devices. Unintentionally filling oxygen vacancies in nFET gate stacks during device processing can make the $V_T$ of the resulting nFET devices dependent on device-width. Therefore, not only must fabrication of CMOS devices be tailored to prevent oxidation processes that benefit pFET devices from also oxidizing nFET gate stacks, but fabrication processes must also be selected to prevent nFET gate stacks from being unintentionally exposed to processes and environments that may result in device-width dependence.

The prior art includes methods for fabricating semiconductor circuits containing both nFETs and pFETs (e.g., CMOS circuits) that involve exposing high-k dielectric layers of gate stacks to oxygen if those gate stacks are intended to be fabricated into pFETs, while simultaneously keeping high-k dielectric layers of other gate stacks unexposed to oxygen if the other gate stacks are intended to be fabricated into nFETs. These methods frequently require the implementation of additional processing steps and materials for the sole purpose of regulating which gate stacks are, and are not, exposed to oxidation processes as well as unfavorable environments, which in turn increases the complexity and expense of fabricating semiconductor devices containing both nFETs and pFETs.

SUMMARY

According to an aspect of the present invention, a method is provided for fabricating a semiconductor circuit. The method includes obtaining a semiconductor structure having a gate stack of material layers including a high-k dielectric layer; oxidizing in a lateral manner the high-k dielectric layer, such that the oxygen content of the high-k dielectric layer is increased first at the sidewalls of the high-k dielectric layer; and completing fabrication of a n-type field effect transistor from the gate stack after laterally oxidizing the high-k dielectric layer of the gate stack.

The present invention also provides another method for creating a semiconductor circuit. The method includes obtaining a semiconductor structure having a first gate stack and a second gate stack, each containing material layers that include a high-k dielectric layer; oxidizing in a lateral manner (i) the high-k dielectric layer of the first gate stack, such that the oxygen content of the high-k dielectric layer of the first gate stack increases first at the sidewalls of the high-k dielectric layer of the first gate stack, and (ii) the high-k dielectric layer of the second gate stack, such that the oxygen content of the high-k dielectric layer of the second gate stack increases first at the sidewalls of the high-k dielectric layer of the second gate stack; and fabricating (i) a n-type field effect transistor from the first gate stack after laterally oxidizing at least the high-k dielectric layer of the first gate stack, and (ii) a p-type field effect transistor from the second gate stack after laterally oxidizing at least the high-k dielectric layer of the second gate stack.

The present invention further provides a semiconductor structure. The structure includes an n-type field effect transistor having a high-k dielectric layer that has higher concentration of oxygen at the sidewalls of the high-k dielectric layer than at the center of the high-k dielectric layer.

DETAILED DESCRIPTION

Figure 1:
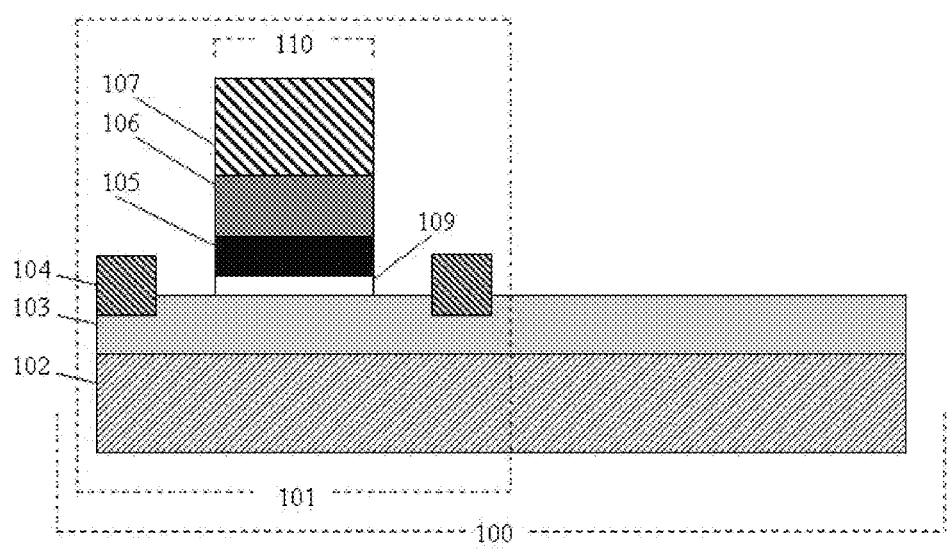
FIG. 1 is a cross sectional view of a preferred initial semiconductor structure according to an embodiment of the obtaining step of the present invention, such that the initial semiconductor structure includes a gate stack of material layers having a layer of high-k dielectric material and the gate stack is exposed to the fabricating environment.

It will be readily understood that the components of the present invention, as generally described and illustrated in the figures herein, may be arranged and designed in a wide variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

Fabrication of semiconductor devices containing both nFETs and pFETs, such as CMOS devices, typically requires some processes utilized solely for creating pFETs and others utilized solely for creating nFETs. This is due to the differences in electrical properties that distinguish nFETs from pFETs, such as $V_T$. nFETs call for a positive $V_T$, while pFETs require a negative $V_T$. This dichotomy typically dictates that the respective gate stacks include different materials, or common materials that have been doped differently. The need to maintain the different characteristic properties of each FET device requires each to be accordingly isolated from processes that are detrimental to maintaining such properties but that benefit the properties of the other type of FET device. Isolating gate stacks from detrimental processes requires additional process steps, such as the addition of protective material layers that are immune to the detrimental processes.

Specifically, the process of exposing gate stacks containing metal gates and high-k dielectrics to oxygen has been one such process that has been accepted within the industry as requiring isolation of gate stacks that are intended for nFET fabrication. The reasoning behind this conclusion is that exposing a material within a gate stack to oxygen causes charged defects to fill, which results in a shift in workfunction of that material and consequently a shift in the $V_T$ of the FET device. As charged defects are filled, the $V_T$ of the eventual gate becomes more positive. This benefits pFETs by reducing the $V_T$ to a smaller negative voltage, but adversely affects nFETs by enlarging the $V_T$ to a greater positive voltage. Furthermore, unintentionally filling charged defects within an nFET during fabrication processes is known in the art to often result in $V_T$ becoming device-width dependent.

It would be preferable if the $V_T$ of both FET device types could be tuned in a way that reduces the complexity and the expense of typical dual-semiconductor-device fabrication, and in a way that avoids adversely affecting the properties of either FET device type. Embodiments of the present invention teach semiconductor-device structures and fabrication methods that utilize the unconventional process of subjecting nFET gate stacks to an anneal in an oxygen environment such that the $V_T$ of the nFET gate stack is tuned while simplifying the overall semiconductor-device fabrication, reducing the cost of fabrication, and decreasing the risk of adversely affecting nFET $V_T$ via unintentionally filling oxygen vacancies in the nFET gate stack during fabrication processes.

The present invention allows for the $V_T$ of the FETs involved in a CMOS device to be tuned to the desired values through selecting materials for the nFET and pFET devices, subjecting the materials in the gate stacks of the nFET and pFET devices to oxidation anneal processes, and doing so at temperatures, pressures, and times that result in the desired $V_T$ levels for each FET device.

Reference is first made to FIGS. 1-7 which illustrate one of the embodiments of the present invention. It is emphasized that in the drawings of the present application, the semiconductor structures include at least one nFET device. The present invention further discloses semiconductor structures that also include a pFET, or a combination of a plurality of at least one nFET and at least one pFET.

Referring to FIG. 1, an embodiment of the present invention is illustrated. The embodiment includes a semiconductor structure 100 having at least one FET device 101 that includes a gate stack 110. It is understood that field effect transistor device structures often also contain standard components, such as Raises Source/Drain 104, a Semiconductor Layer 103, an Insulator Layer 102, and Sidewall Spacers 108. The FET device 101 of the semiconductor structure 100 includes a gate stack 110 that is disposed on a semiconductor layer 103 and that contains a high-k dielectric layer 105. The gate stack also includes a gate-insulating layer 109, a work-function conductor layer 106 and a gate conducting layer 107.

The semiconductor layer 103 can be any semiconductor material, either doped or undoped, including but not limited to silicon, silicon germanium, germanium, silicon carbide, a III-V compound semiconductor, a II-VI compound semiconductor, a carbon-based semiconductor such as a carbon nanotube or graphene, an organic semiconductor, or any multilayer or other combination of these. The present invention has applicability to both semiconductor-on-insulator (e.g. silicon-on-insulator, SOI) and bulk semiconductor technology.

The high-k dielectric layer 105 is preferably a selection of dielectric material with a higher dielectric constant than $SiO_2$ including at least one metallic element, such as hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_2O_3$), lanthanum aluminate ($LaAlO_3$), zirconium silicate ($ZrSiO_x$), and any other dielectric material having a dielectric constant higher than that of $SiO_2$. As such, the high-k dielectric layer 105 can be a selected single material or can be a selection of different dielectric materials, which can be intermixed preferably resulting in a vertical composition gradient having a compositional depth profile of metal ion density.

The work-function conductor layer 106 is preferably in contact with the high-k dielectric layer 105. The work-function conductor layer can be made of a conductive refractory metal nitride, such as titanium nitride (TiN), tantalum nitride (TaN), titanium aluminum nitride (TiAlN), tantalum aluminum nitride (TaAlN), any combinations thereof, as well as other materials.

In the example semiconductor structure 100 shown in FIG. 1, a gate-conducting layer 107 is included in contact with the work-function conductor layer 106 in gate stack 110. The gate-conducting layer 107 of gate stack 110 can be made of such materials as amorphous silicon, an amorphous silicon containing alloy, polycrystalline silicon, a polycrystalline silicon containing alloy, a silicide, a silicide on silicon combination, tungsten, titanium nitride, tantalum nitride, any other conducting material, or any combination or multilayer stack of conducting materials. Exemplary silicon containing alloys are silicon germanium alloy, silicon carbon alloy, and silicon germanium carbon alloy. Additionally, the gate-conducting layer may be doped with dopants, such as n-type or p-type dopants depending on the intended functionality of the gate stack.

Referring to FIG. 1, further parts of semiconductor 100 are the raised source/drain regions 104 of the FET device 101, as well as the sidewall spacers 108. The sidewall spacers 108 are in contact with opposite sides of the gate stack 110 and in contact with the semiconductor layer 103. The sidewall spacers 108 are preferably in direct contact with all material layers of the gate stack 110 of the FET device 101. The raised source/drain regions 104 are disposed on the semiconductor layer 103 adjacent to each sidewall spacer 108 of gate stack 110.

In a preferred embodiment of the present invention, insulator layer 102 is of $SiO_2$, semiconductor layer 103 is of Si, raised source/drain 104 is also of Si, gate-insulating layer 109 is of $SiO_2$, high-k dielectric layer 105 includes $HfO_2$, work-function conductor layer 106 includes TiN, gate-conductor layer 107 is of silicide on Si, and sidewall spacers 108 are of $Si_3N_4$.

Manufacturing of nFET, pFET and CMOS structures is very well established in the art. It is understood that there are a large number of steps involved in such processing, and each step might have practically endless variations known to those skilled in the art. Many possible methods of fabrication that lead to a structure as in FIG. 1 are known in the art. For example, see U.S. Pat. No. 7,488,656 for a description of one possible method of fabricating a high-k dielectric metal gate CMOS semiconductor structure. Furthermore, a vast range of known processing techniques are available for fabricating the initial semiconductor structures of the present invention.

As is known in the art, performing a dopant activation anneal on a gate stack at a high temperature affects the composition of the high-k dielectric materials in the gate stack such that a loss of oxygen in the dielectric materials occurs due to decomposition. As a result, semiconductor structures intended for the present invention must not have dopant activation anneal processes, such as those occurring above 800° C., carried out after the oxidation anneal process of the present invention is applied. Accordingly, any dopant activation anneal process that is required for processing of the semiconductor structures intended for the present invention must be carried out prior to the process of applying the oxidation anneal of the present invention.

Figure 2:
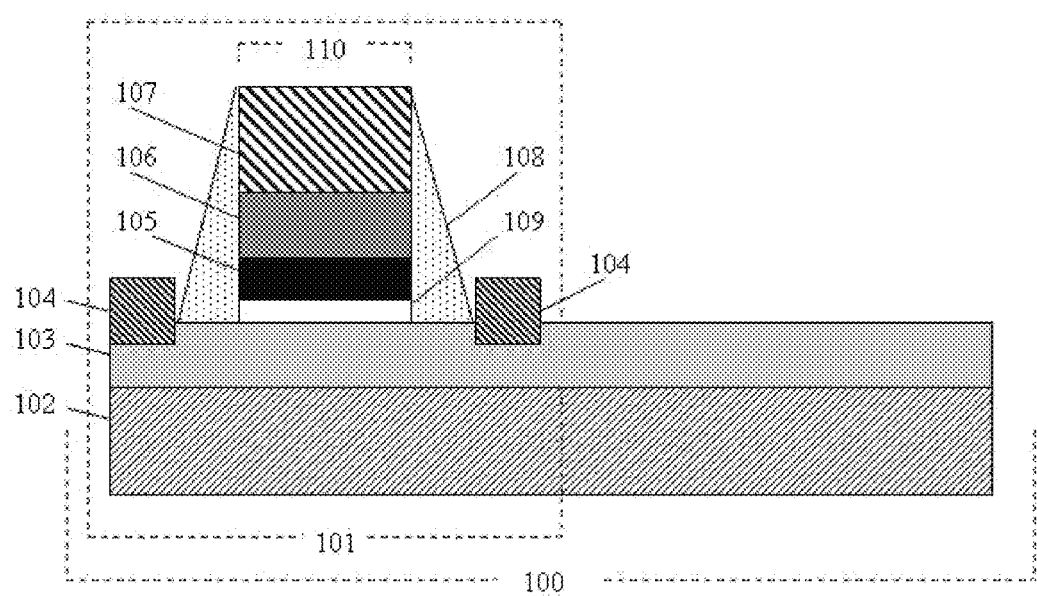
FIG. 2 is a cross sectional view of the initial semiconductor structure in FIG. 1 before material (sidewall spacers) has been removed from the sidewalls of the gate stack in order to provide a preferred initial semiconductor structure.

Referring to FIG. 2, an initial semiconductor structure of the present invention is illustrated where the n-FET device 101 of the semiconductor structure 100 has had the sidewall spacers 108 removed from the sidewalls of the n-FET gate stack 110. In order to prepare the n-FET device for application of an oxidation anneal, a process for selectively removing material from a semiconductor structure, many of which are well known in the art, may be used to remove the sidewall spacers 108 from the semiconductor structure 100, such as those utilizing masks and etches involving diluted HF.

Figure 3:
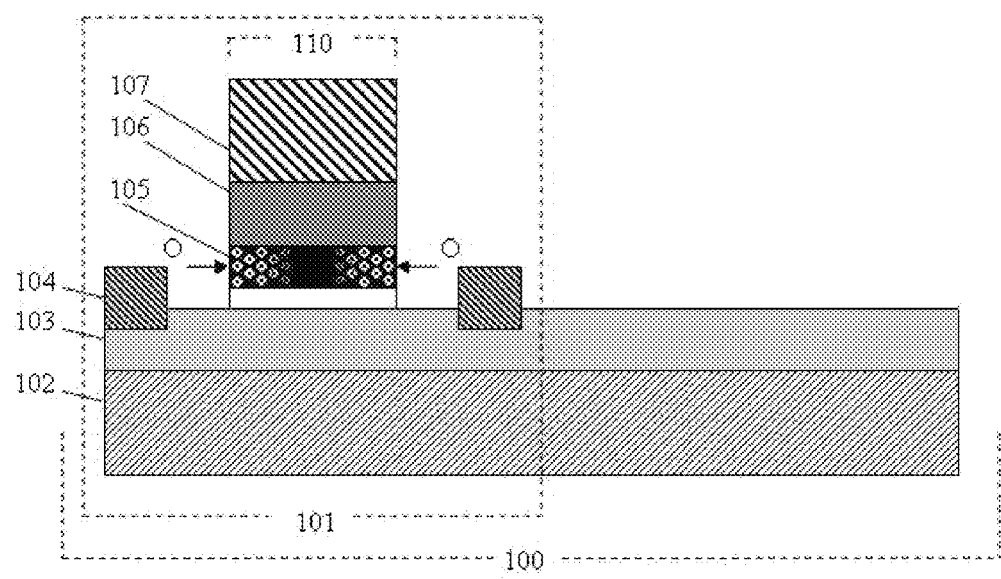
FIG. 3 is a cross sectional view of semiconductor structure in FIG. 1 some time after the preferred lateral oxidation anneal process has begun diffusing oxygen at the sidewalls of the high-k dielectric layer.
Figure 4:
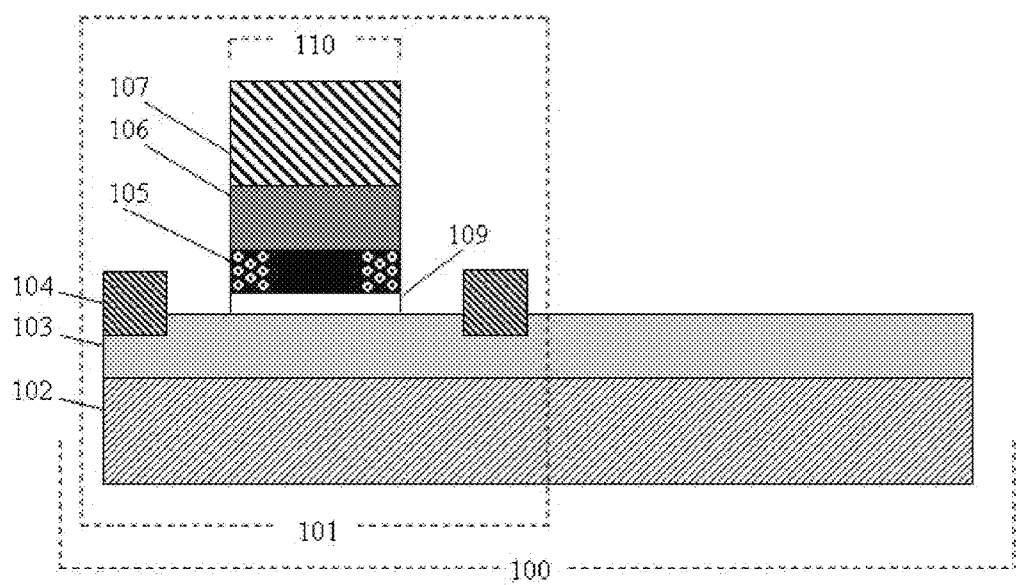
FIG. 4 is a cross sectional view of the semiconductor structure in FIG. 2 after the preferred lateral oxidation anneal process has diffused oxygen into the sidewalls of the high-k dielectric layer towards the center of the high-k dielectric layer and stopping after partially oxidizing the high-k dielectric layer.
Figure 5:
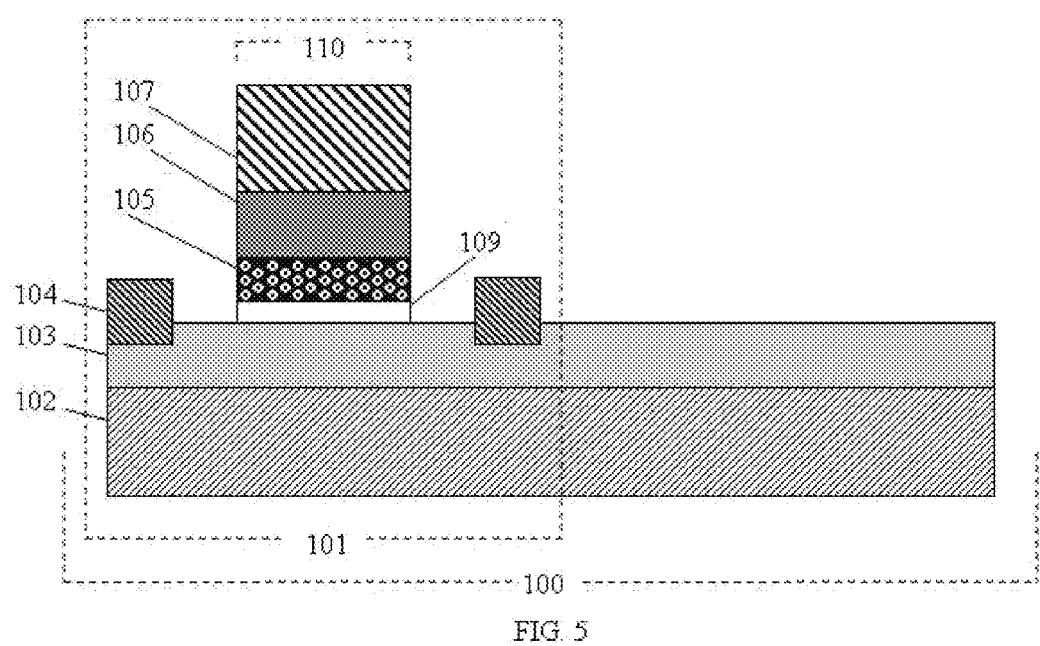
FIG. 5 is a cross sectional view of the semiconductor structure in FIG. 2 after the preferred lateral oxidation anneal process has diffused oxygen into the sidewalls of the high-k dielectric layer, achieving complete lateral oxidation of the high-k dielectric layer.
Figure 6:
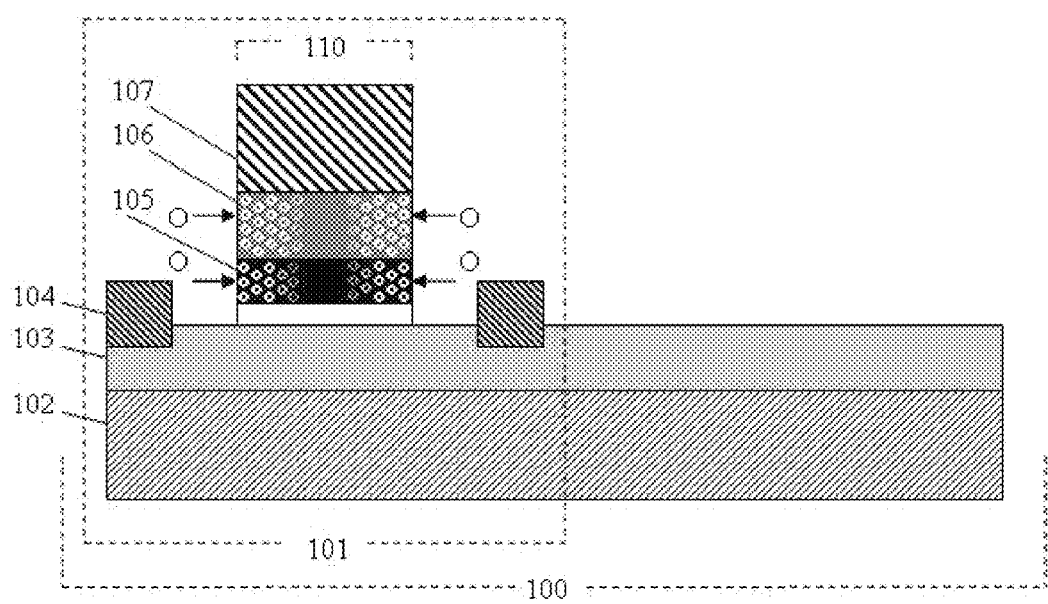
FIG. 6 is a cross sectional view of the semiconductor structure of FIG. 2 some time after the preferred lateral oxidation process has begun diffusing oxygen into the sidewalls of the high-k dielectric layer and the work-function conductor layer.

The exemplary semiconductor structure is oxidized by being subjected to an anneal in an oxidizing environment preferably comprising oxygen atoms, oxygen ions, or oxygen-containing molecules such as molecular oxygen ($O_2$), water vapor ($H_2O$), nitric oxide (NO), nitrous oxide ($N_2O$), or any other suitable oxidizing species, as shown in FIG. 3, in order to achieve the desired extent of lateral oxidation of at least the high-k dielectric layer 105, as shown in FIGS. 4, 5 and 6. The temperature of the preferred anneal may be from approximately 300° C. to about 600° C., and preferably from about 400° C. to about 500° C. The oxygen partial pressure may be from approximately 100 mTorr to about 20 atm, and typically from 0.1 atm to about 1 atm. Other partial pressures that are lesser than or greater than the aforementioned partial pressure range can also be employed. The duration of the oxidation anneal may be from about 10 minute to about 6 hours. Other durations that are lesser than or greater than the aforementioned duration range can also be employed. In general, the preferred duration of the anneal decreases with an increase in either the anneal temperature, or the partial pressure of the oxygen environment involved, or both. The temperature, pressure and duration of the anneal process may be correspondingly chosen to achieve the desired extent of oxidation of the high-k dielectric layer 105. Furthermore, the oxidation anneal process may be carried out through multiple process at various pressures, temperatures, and durations, as this may be advantageous to achieve a more complete oxidation of the high-k dielectric layer 105.

FIG. 3 illustrates a step of the present invention in which the exposed gate stack 110 of the n-FET device 101 is subjected to a process to achieve lateral oxidation, such that oxygen diffuses into at least the high-k dielectric layer 105. In FIG. 3, the high-k dielectric layer 105 of the FET device 101 is shown with arrows indicating that the lateral oxidation process is characterized by affecting the oxygen content of the high-k dielectric layer 105 first at the sidewalls of the gate stack 110 and continues to diffuse oxygen in towards the center of the gate stack 110 as the duration of the process continues.

During the preferred oxidation anneal process, atomic oxygen, or oxygen molecules, or both, diffuse into at least the high-k dielectric layer 105. The effects of the diffusion on the gate stack 110 are illustrated in FIG. 4, FIG. 5, and FIG. 6, in which the atomic oxygen and/or oxygen molecules are incorporated into the high-k dielectric layer. The oxygen content of the high-k dielectric layer first increases at the sidewalls of the gate stack 110 which are immediately exposed to the oxidation anneal environment and thereafter the oxygen content continues to increase towards the center of the gate stack 110 as the duration of the oxidation anneal continues.

Referring to FIG. 4, the high-k dielectric layer 105 is shown as having an oxygen content that is higher near the edge than near the center of the high-k dielectric layer. The high-k dielectric layer 105 has preferably been subjected to a lateral oxidation anneal process at a pressure and temperature, as well as for a duration, to cause oxygen to diffuse into the high-k dielectric layer 105 and result in partially oxidizing the high-k dielectric layer 105 such that the oxygen does not diffuse to the center of the nFET gate stack 110.

Referring to FIG. 5, the high-k dielectric layer 105 is shown as having oxygen diffused throughout the entire width of the high-k dielectric layer 105, and as such FIG. 5 shows the high-k layer 105 of the nFET gate stack 110 as having been completely oxidized by the lateral oxidation process.

Referring to FIG. 6, another embodiment of the present invention is illustrated where both the high-k dielectric layer 105 and the work-function conductor layer 106 are exposed to the lateral oxidation anneal process such that oxygen diffuses into both layers causing the oxygen content of the high-k dielectric layer 105 and the work-function conductor layer 106 is increased first at the sidewalls of the gate stack 110 progress sing towards the center of the gate stack 110 as the duration of the oxidation anneal increases.

Figure 7:
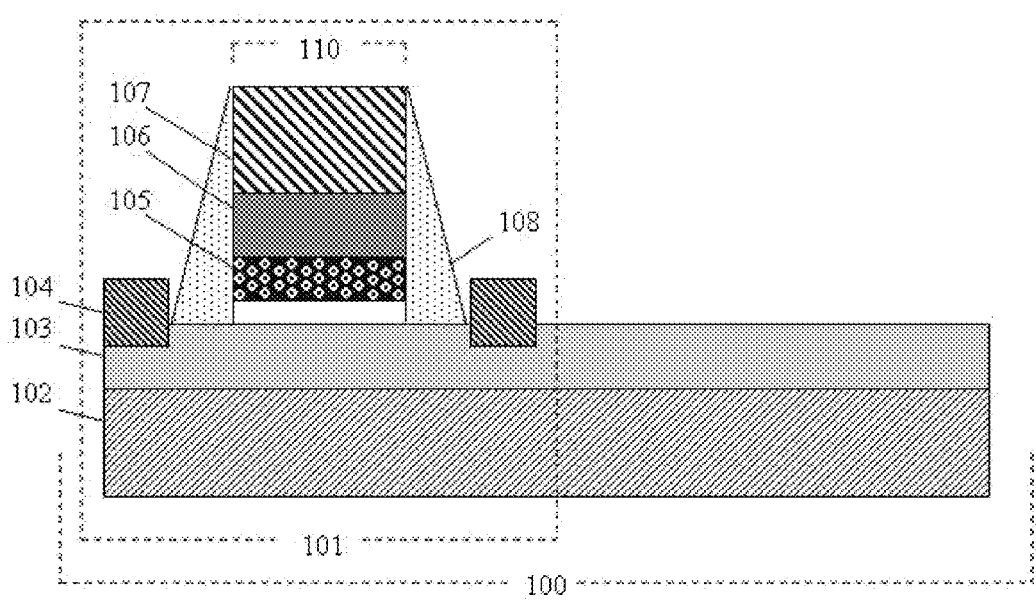
FIG. 7 is a cross sectional view of the semiconductor structure of FIG. 5 after sidewall spacers have been fabricated in contact with the sidewalls of the gate stack.

Referring to FIG. 7, the FET device 101 is shown as having had sidewall spacers 108 reapplied to the sidewalls of the gate stack 110 after at least the high-k dielectric layer 105 has been oxidized to a desired extent.

Figure 8:
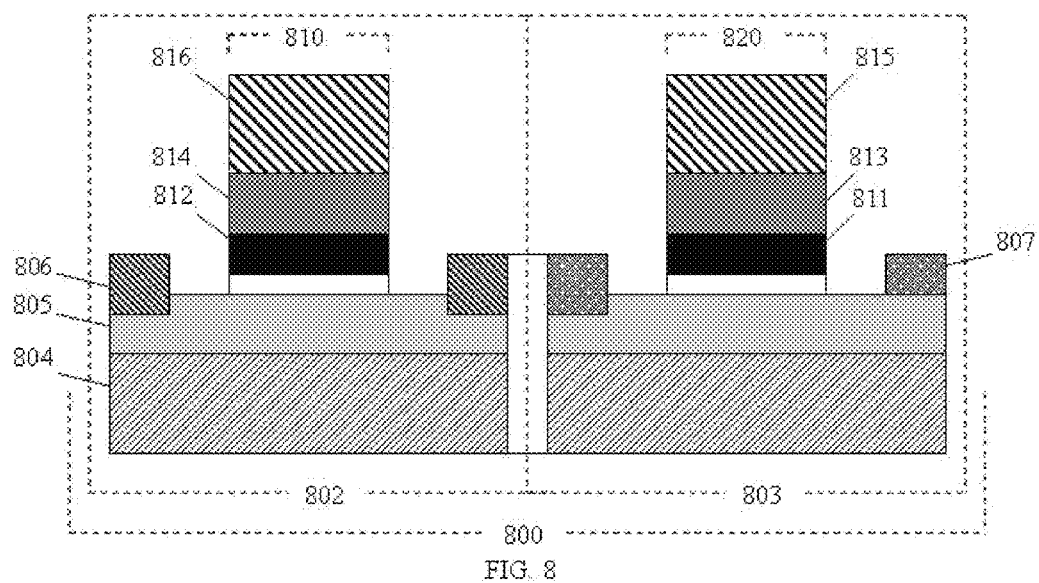
FIG. 8 is a cross section view according to a preferred embodiment of the initial semiconductor of the obtaining step of the present invention where the semiconductor structure includes two gate stacks of material layers, each having a layer of high-k dielectric material, one being an n-FET gate stack and the other being a p-FET gate stack.

Referring to FIG. 8, another embodiment of the present invention is illustrated where the semiconductor structure 800 includes a nFET device 802 and a pFET device 803. The semiconductor structure 800 contains a shallow trench isolation (STI) region 801 between the nFET 802 and the pFET 803. Each FET device contains a gate stack, 810 and 820. Each gate stack contains: a gate-insulator layer, 808 and 809; a high-k dielectric layer, 811 and 812; a work-function conductor layer, 813 and 814; a gate-conducting layer, 815 and 816; raised sources/drains, 806 and 807; and sidewall spacers, 817 and 818. The FET devices, 802 and 803, are both disposed on a semiconductor layer 805, which resides on an insulator layer 804.

In a preferred embodiment of the present invention, the gate stacks 810 and 820 utilize the same material for the high-k dielectric layers, 811 and 812, and also utilize the same material for the work-function conductor layers, 813 and 814. Preferably the high-k dielectric layers, 811 and 812, includes HfO2 and the work-function conductor layers, 813 and 814, includes TiN. Using these materials causes the nFET 802 to have a low initial $V_T$ and the pFET to have a high initial $V_T$, which are thereafter respectively raised and lowered to $V_T$ values desirable in certain preferred embodiments by applying an oxidation anneal process. This present invention is thereby able to reduce the complexity of CMOS processing, decrease the cost of fabrication, and increase the $V_T$ stability of CMOS devices by utilizing the unconventional process of subjecting an nFET gate stack to a lateral oxidation anneal.

Figure 9:
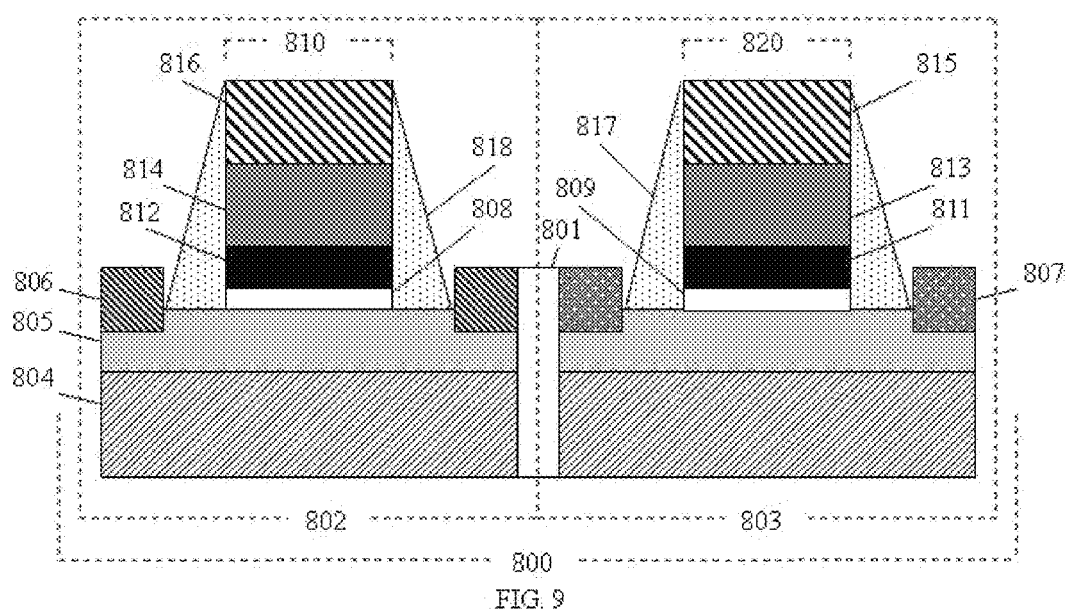
FIG. 9 is a cross sectional view of the semiconductor structure in FIG. 8 slightly after lateral oxidation has begun diffusing oxygen at the sidewalls of the high-k dielectric layers of both gate stacks.

Referring to FIG. 9, an embodiment of the present invention is illustrated where the FET devices, 802 and 803, of the semiconductor structure 800 have had any sidewall spacers, such as 817 and 818, removed from the FET devices, thereby exposing the sidewalls of the respective gate stacks, 820 and 810. Processes for selectively removing material are well known in the art, such as those utilizing masks and etches involving diluted HF, and many may be used to remove material, such as the sidewall spacers 818 and 817, from the semiconductor structure 800.

Figure 10:
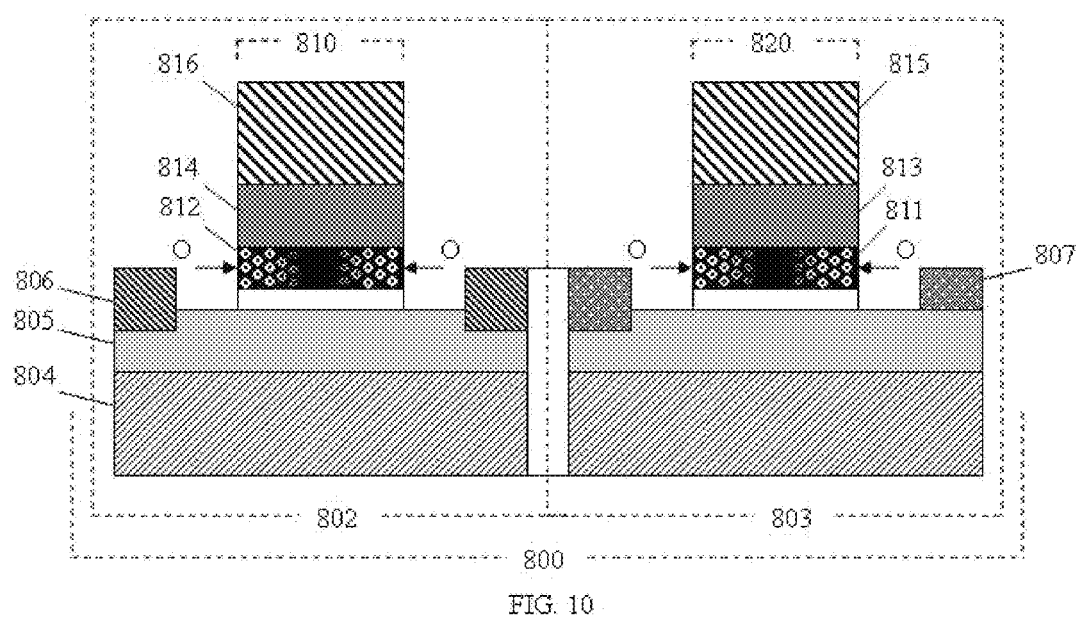
FIG. 10 is a cross sectional view of the semiconductor structure in FIG. 9 after achieving complete lateral oxidation of the high-k dielectric layers in both gate stacks.

Referring to FIG. 10, application of the preferred lateral oxidation anneal process to the gate stacks, 810 and 820, of the nFET device 802 and the pFET device 803, is illustrated, such that oxygen is shown as diffusing into at least the high-k dielectric layers, 812 and 813. In FIG. 10, the high-k dielectric layers 812 and 811 of the respective gate stacks 810 and 820 are shown with arrows indicating the lateral oxidation anneal process increases the oxygen content of the high-k layers, 812 and 813, first at the sidewalls of the gate stacks 810 and 820 due to how the high-k dielectric layers 812 and 811 are exposed to the lateral oxidation anneal process. And as such the lateral oxidation anneal process diffuses oxygen from the sidewalls of the gate stacks 810 and 820 towards the center of the gate stacks 810 and 820 as the duration of the process increases.

Figure 11:
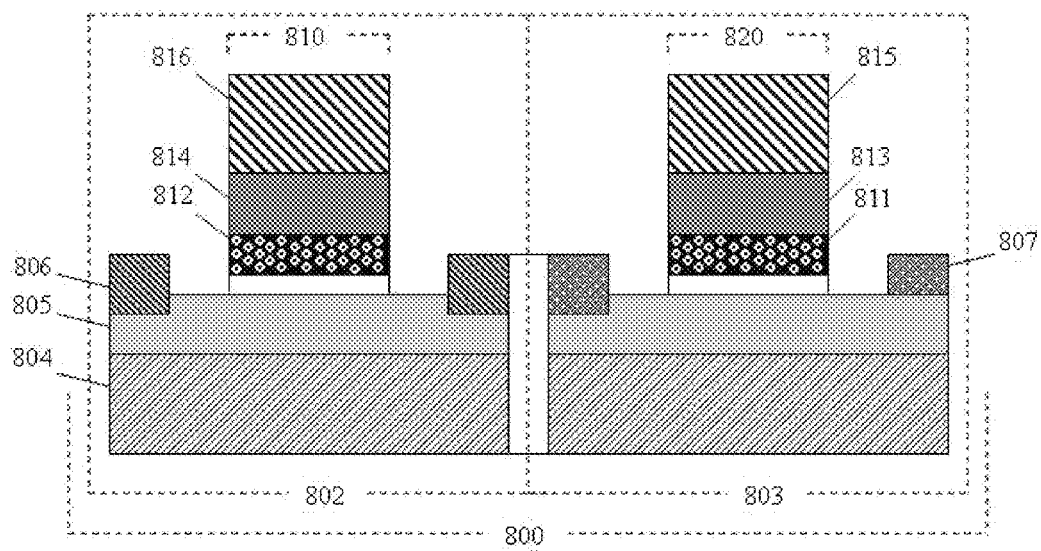
FIG. 11 is a cross sectional view of the semiconductor structure of FIG. 11 after spacers have been added to the sidewalls of both gate stacks.

Referring to FIG. 11, both the nFET device 802 and the pFET device 803 are shown as having been exposed to the oxidation anneal process for a duration sufficient to diffuse oxygen across the entire width of the respective high-k dielectric layers, 812 and 811, and as such FIG. 11 shows the high-k dielectric layers, 812 and 811, as having been completely oxidized by the lateral oxidation anneal process such that the oxygen content has increased throughout the entirety of the high-k dielectric layers 812 and 811.

Figure 12:
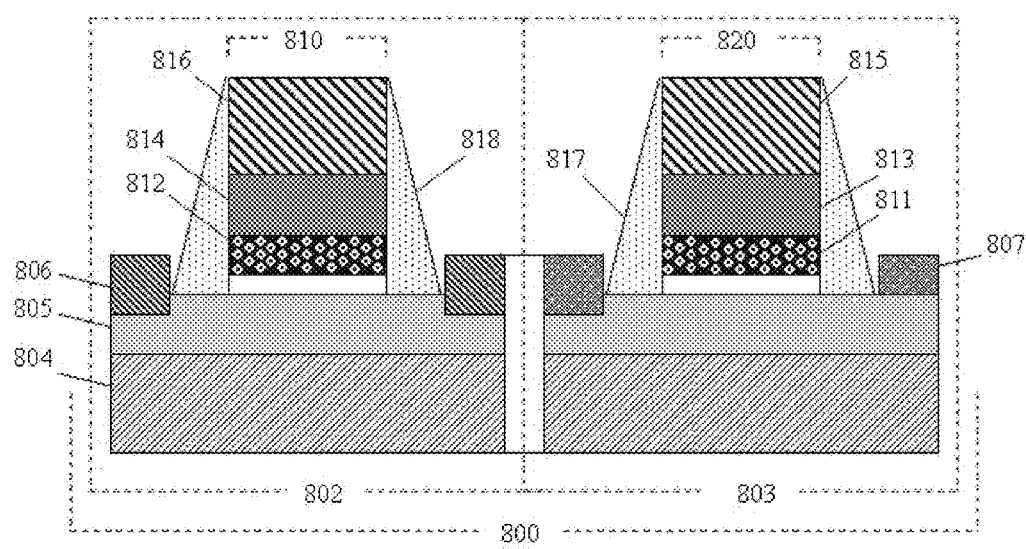
FIG. 12 is a cross sectional view of a semiconductor structure according to an embodiment of the present invention where the semiconductor structure includes two gate stacks of material layers, each having a high-k dielectric material layer, one being a n-FET gate stack and one being a p-FET gate stack, after the high-k dielectric layer of the n-FET gate stack has been completely laterally oxidized and the high-k dielectric layer of the p-FET gate stack has been partially laterally oxidized.

Referring to FIG. 12, the nFET device 802 and pFET device 803 are shown as having had material applied to the sidewalls of the respective gate stacks 810 and 820 to create sidewall spacers 818 and 817 after at least the high-k dielectric layers 812 and 811 have been subjected to an oxidation process. In FIG. 12, an embodiment of the present invention is illustrated with the high-k dielectric layers 812 and 811 having been exposed to a lateral oxidation anneal process for a duration sufficient to diffuse oxygen across the entire width of nFET device 802 and pFET device 803.

Figure 13:
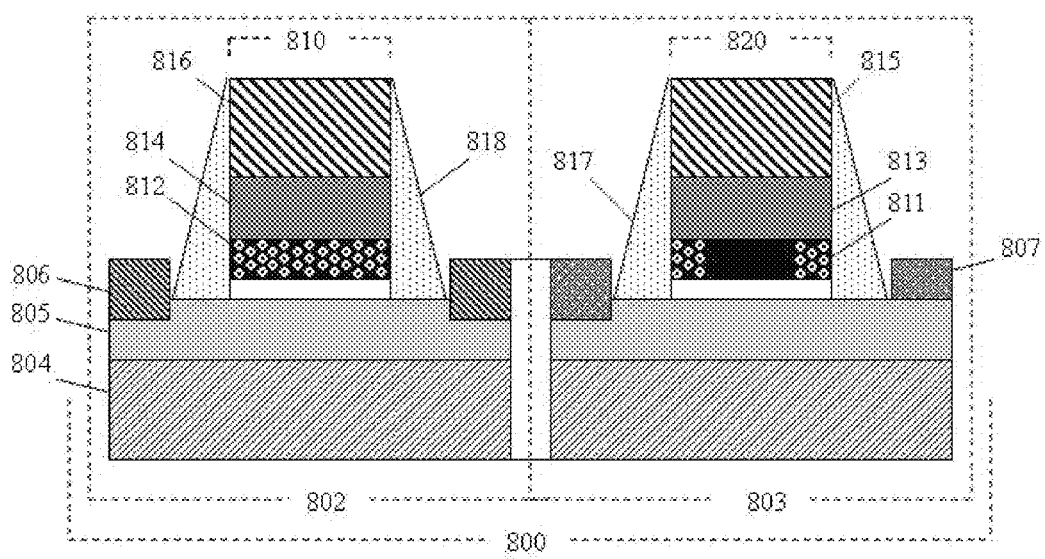
FIG. 13 is a cross sectional view of a semiconductor structure according to an embodiment of the present invention where the semiconductor structure includes two gate stacks of material layers, each having a high-k dielectric material layer, one being a n-FET gate stack and one being a p-FET gate stack, after the high-k dielectric layer of the n-FET gate stack has been completely laterally oxidized and the high-k dielectric layer of the p-FET gate stack has been partially laterally oxidized.

Referring to FIG. 13, a further embodiment of the present invention is illustrated where the extent of oxidation occurring within the high-k dielectric layers 812 and 811 is not equal, such that the high-k dielectric layer 812 of the nFET device 802 is completely oxidized, while the high-k dielectric layer 811 of the nFET device 803 is partially oxidized.

Figure 14:
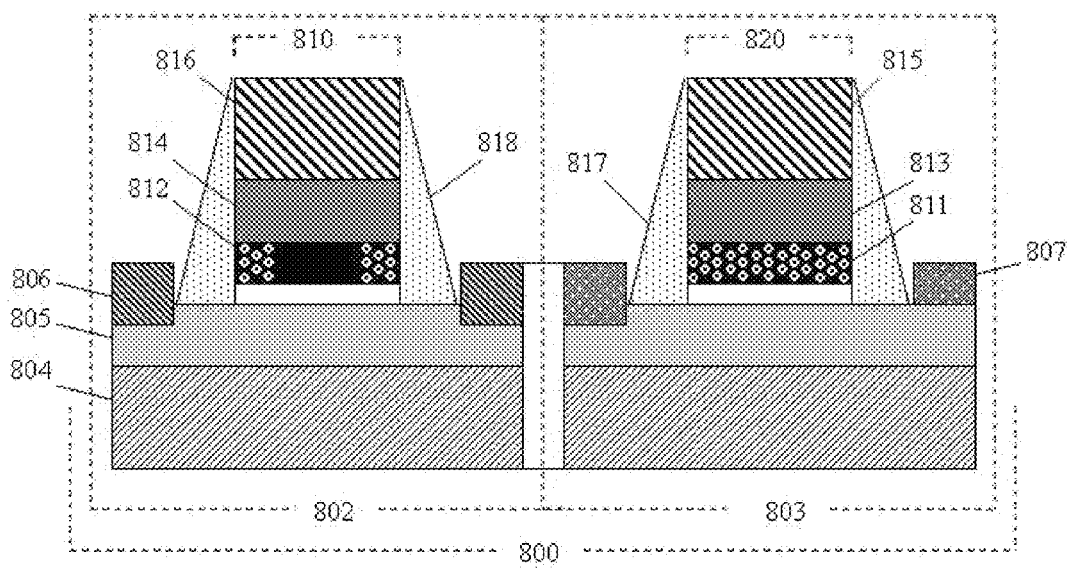
FIG. 14 is a cross sectional view of a semiconductor structure according to an embodiment of the present invention where the semiconductor structure includes two gate stacks of material layers, each having a high-k dielectric material layer, one being a n-FET gate stack and one being a p-FET gate stack, after the high-k dielectric layer of the n-FET gate stack has been partially laterally oxidized and the high-k dielectric layer of the p-FET gate stack has been completely laterally oxidized.

Referring to FIG. 14, another embodiment of the present invention is illustrated where the extent of oxidation occurring within the high-k dielectric layers of 812 and 811 is not equal, such that the high-k dielectric layer 812 of the nFET device 802 is partially oxidized while the high-k dielectric layer 811 of the pFET device 803 is completely oxidized.

Figure 15:
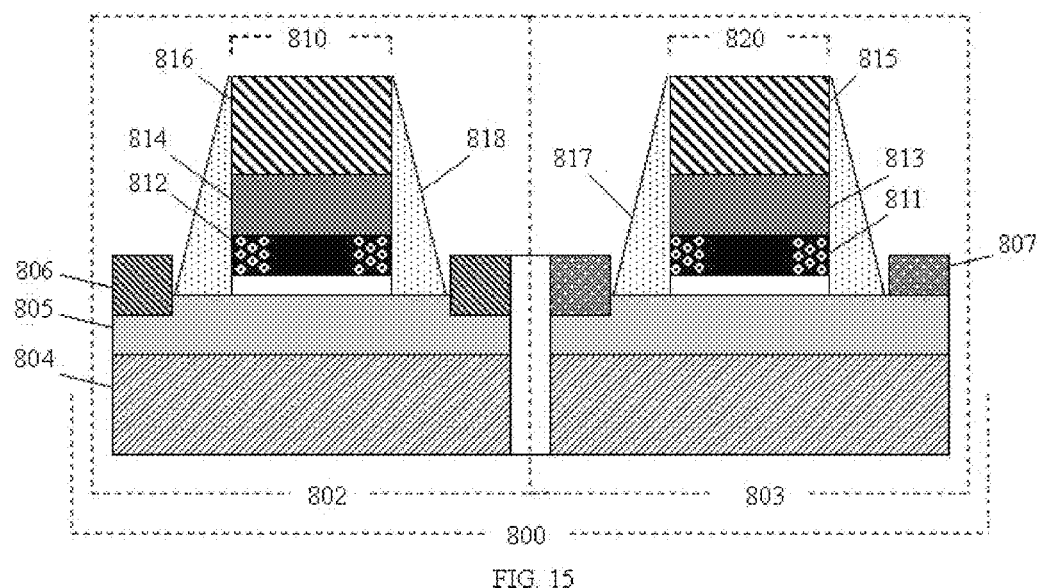
FIG. 15 is a cross sectional view of a semiconductor structure according to an embodiment of the present invention where the semiconductor structure includes two gate stacks of material layers, each having a high-k dielectric material layer, one being a n-FET gate stack and one being a p-FET gate stack, after the high-k dielectric layer of the n-FET gate stack has been partially laterally oxidized and the high-k dielectric layer of the p-FET gate stack has been partially laterally oxidized.

Referring to FIG. 15, another embodiment of the present invention is illustrated where the extent of oxidation having occurred within the high-k dielectric layers 812 and 811 is such that the high-k dielectric layers 812 and 811 of both the nFET device 802 and the pFET device 803 are partially oxidized.

Referring to FIG. 16, another embodiment of the present invention is illustrated. The embodiment lays out a method for forming a semiconductor circuit including obtaining a semiconductor structure having at least one gate stack of material layers that includes a layer of high-k dielectric material, laterally oxidizing at least the high-k dielectric material layer, and completely fabricating at least one n-type FET from the gate stack that includes a layer of laterally oxidized high-k dielectric material; and also having the optional steps of: performing an activation anneal on at least on gate stack, removing spacers from the sidewalls of at least one gate stack, and adding spacers to the sidewalls of at least one gate stack.

It will be apparent to those skilled in the art having regard to this disclosure that other modifications of the present invention beyond those embodiments specifically described here can be made without departing from the spirit of the invention. For example, the semiconductor devices and layered structures described above can include additional optional layers and the methods for fabricating such devices and structures can include additional optional steps for depositing such layers. Accordingly, such modifications are considered within the scope of the present invention as limited solely by the appended claims.

What is claimed is:

1. A method for fabricating a semiconductor circuit, the method comprising:
   obtaining a semiconductor structure having a first gate stack and a second gate stack, each containing material layers that include a high-k dielectric layer and a work-function conductor layer;
   oxidizing in a lateral manner (i) the high-k dielectric layer of the first gate stack, such that an oxygen content of the high-k dielectric layer of the first gate stack increases first at the sidewalls of the high-k dielectric layer of the first gate stack, (ii) the high-k dielectric layer of the second gate stack, such that the oxygen content of the high-k dielectric layer of the second gate stack increases first at the sidewalls of the high-k dielectric layer of the second gate stack, and (iii) the work-function conductor layer of the first gate stack, such that oxygen content increases first near the sidewalls of the work-function conductor layer of the first gate stack; and
   fabricating (i) a n-type field effect transistor from the first gate stack after laterally oxidizing at least the high-k dielectric layer of the first gate stack, and (ii) a p-type field effect transistor from the second gate stack after laterally oxidizing at least the high-k dielectric layer of the second gate stack.

2. The method of claim 1, wherein the high-k dielectric layer of the first gate stack and the high-k dielectric layer of the second gate stack are comprised of the same selection of dielectric material.

3. The method of claim 1, wherein the high-k dielectric layer of the first gate stack and the high-k dielectric layer of the second gate stack are not comprised of the same selection of dielectric material.

4. The method of claim 1, wherein the oxidizing further comprises achieving complete lateral oxidation of the high-k dielectric layer of the first gate stack, such that oxygen diffuses to the center of the high-k dielectric layer of the first gate stack.

5. The method of claim 4, wherein oxidizing further comprises achieving complete lateral oxidation of the high-k dielectric layer of the second gate stack, such that oxygen diffuses to the center of the high-k dielectric layer of the second gate stack.

6. The method of claim 1, wherein the oxidizing further comprises achieving partial lateral oxidation of the high-k dielectric layer of the first gate stack, such that oxygen does not diffuse to the center of the high-k dielectric layer of the first gate stack.

7. The method of claim 6, wherein oxidizing further comprises achieving complete lateral oxidation of the high-k dielectric layer of the second gate stack, such that oxygen diffuses to the center of the high-k dielectric layer of the second gate stack.

8. The method of claim 1, wherein the oxidizing further comprises achieving complete lateral oxidation of the high-k dielectric layer of the first gate stack.

9. The method of claim 8, wherein oxidizing further comprises achieving partial lateral oxidation of the high-k dielectric layer of the second gate stack, such that oxygen does not diffuse to the center of the high-k dielectric layer of the second gate stack.

10. The method of claim 1, wherein the oxidizing further comprises achieving partial lateral oxidation of the high-k dielectric layer of the first gate stack, such that oxygen does not diffuse to the center of the high-k dielectric layer of the first gate stack.

11. The method of claim 10, wherein oxidizing further comprises achieving partial lateral oxidation of the high-k dielectric layer of the second gate stack, such that oxygen does not diffuse to the center of the high-k dielectric layer of the second gate stack.

12. The method of claim 1, wherein oxidizing further comprises oxidizing in a lateral manner the work-function conductor layer of the second gate stack, such that oxygen content increases first near the sidewalls of the work-function conductor layer of the second gate stack.

13. The method of claim 1, wherein the work-function conductor layer of the first gate stack and the work-function conductor layer of the second gate stack are of the same work-function conductor material.

14. The method of claim 13, wherein the high-k dielectric layer of the first gate stack and the high-k dielectric layer of the second gate stack are of the same selection of dielectric material.

15. The method of claim 14, wherein the work-function conductor layer of the first gate stack and the work-function conductor layer of the second gate stack are of the same work-function conductor material, and the high-k dielectric layer of the first gate stack and the high-k dielectric layer of the second gate stack are not of the same selection of dielectric material.

16. The method of claim 1, wherein the work-function conductor layer of the first gate stack and the work-function conductor layer of the second gate stack are not of the same work-function conductor material, and the high-k dielectric layer of the first gate stack and the high-k dielectric layer of the second gate stack are not of the same selection of dielectric material.

\* \* \* \* \*